(12) United States Patent
Lee

(10) Patent No.: US 7,294,896 B2
(45) Date of Patent: Nov. 13, 2007

(54) PHOTODETECTOR WITH CHARGE-CARRIER REFLECTOR

(75) Inventor: Donald L. Lee, Thousand Oaks, CA (US)

(73) Assignee: Teledyne Licensing, LLC, Thousand Oaks, CA (US)

( * ) Notice: Subject to any disclaimer, the term of this patent is extended or adjusted under 35 U.S.C. 154(b) by 111 days.

(21) Appl. No.: 11/237,480

(22) Filed: Sep. 27, 2005

(65) Prior Publication Data

US 2007/0069229 A1    Mar. 29, 2007

(51) Int. Cl.
*H01L 31/0232* (2006.01)

(52) U.S. Cl. .................. 257/432; 257/436; 257/452; 257/461; 257/E31.064

(58) Field of Classification Search ............... 257/432
See application file for complete search history.

(56) References Cited

U.S. PATENT DOCUMENTS

| | | | | |
|---|---|---|---|---|
| 5,633,527 | A | * | 5/1997 | Lear ........................... 257/432 |
| 6,147,349 | A | * | 11/2000 | Ray ......................... 250/338.4 |
| 6,660,988 | B2 | | 12/2003 | Lee et al. |
| 2004/0183152 | A1 | * | 9/2004 | Yoneda et al. .............. 257/436 |

* cited by examiner

*Primary Examiner*—Tu-Tu V. Ho
(74) *Attorney, Agent, or Firm*—Koppel, Patrick, Heybl & Dawson

(57) ABSTRACT

A photodetector includes a charge carrier collector and a charge carrier concentrator that redirects onto the collector charge carriers that are not initially headed towards the collector.

7 Claims, 3 Drawing Sheets

PHOTODETECTOR WITH CHARGE-CARRIER REFLECTOR

BACKGROUND OF THE INVENTION

1. Field of the Invention

This invention relates to photodetectors, and particularly to photodetectors that have charge carrier reflectors.

2. Description of the Related Art

Desirable characteristics of commercial photodetectors include high quantum efficiency (QE), otherwise known as sensitivity, increased signal-to-noise ratio and the ability to manufacture them with reduced manufacturing defects. A photodetector with higher QE may translate into faster image capture, while increased signal-to-noise ratio means fewer image artifacts when used with reduced illumination. Reducing manufacturing defects translates into increase wafer yields, higher detector array operability and reduction in the unit cost for each photodetector.

FIG. 1 illustrates a prior art single-pixel photodetector 100. The photodetector includes an absorber layer 105 that produces electron-hole pairs (charge-carriers) in response to absorbed photons, a buffer layer 110 to inhibit such charge-carriers from drifting into the substrate 115, and a collector layer 120 that forms a P—N junction with the absorber layer 105 to collect the minority charge carriers (holes). Majority carriers (electrons) are collected by the absorber layer contact 130. Because charge carriers typically recombine after a predetermined average diffusion length, lateral spreading of the charge carriers results in reduced QE as they recombine prior to capture by the collector layer 120. The absorber layer itself may produce spurious charge carriers from thermal effects, rather than photon absorption, to generate dark current between a collector layer contact 125 and absorber layer contact 130 thereby reducing the signal-to-noise ratio. Also, any significant defects at the P—N junction between the junction and absorber layers 120, 105 can result in a defective photodetector and reduced wafer yields for the photodetectors. While reducing the area of the collector layer 120 would reduce the opportunity to develop manufacturing defects at the P—N junction and would increase wafer yields, such a resizing would reduce QE due to charge carrier drift and recombination prior to capture by the collector layer 120, since fewer of the charge carriers would be likely to reach the reduced collector layer 120. Resizing also would not be as effective in reducing dark current which limits the signal-to-noise ratio for the photodetector.

A need still exists, therefore, to increase charge carrier capture prior to recombination, to reduce generation of thermally induced charge carriers and to increase photodetector manufacturing yields without adversely affecting overall QE.

SUMMARY OF THE INVENTION

A photodetector is disclosed that includes a charge carrier collector and a charge carrier concentrator that redirects onto said collector charge carriers that are not initially headed towards said collector.

In one embodiment of the invention, a photodector system includes an absorber layer establishing a mesa and generating charge carriers in response to photon absorption, a passivation layer formed on the mesa to reflect charge carriers from side walls of the mesa to reduce lateral diffusion of the charge carriers and a collector layer recessed in the mesa to capture the reflected charge carriers and charge carriers directly incident from the absorber layer.

A method is also described for detecting photons that includes generating charge carriers in response to absorbed photons, reflecting them towards a charge-carrier collector and collecting the charge carriers prior to their recombination.

BRIEF DESCRIPTION OF THE DRAWINGS

The components in the figures are not necessarily to scale, emphasis instead being placed upon illustrating the principles of the invention. Like reference numerals designate corresponding parts throughout the different views.

DETAILED DESCRIPTION OF THE INVENTION

A photodetector apparatus is disclosed that has a charge carrier collector and charge carrier concentrator that redirects onto the collector those charge carriers that are not initially headed towards the collector. With a combination of smaller collector size and reflector-based capture of laterally diffusing charge carriers, the QE of the photodetector is improved while reducing the opportunity for dark current and manufacturing defects.

Figure 1:
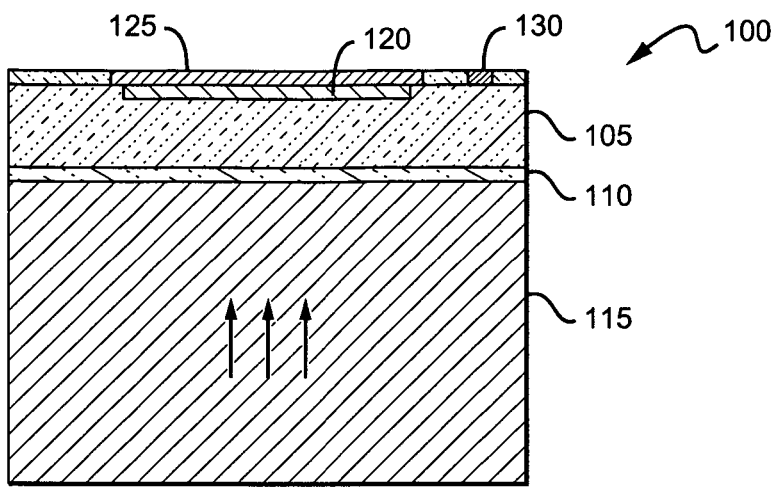
FIG. 1 is cross-sectional view of a prior art single pixel photodetector.
Figure 2:
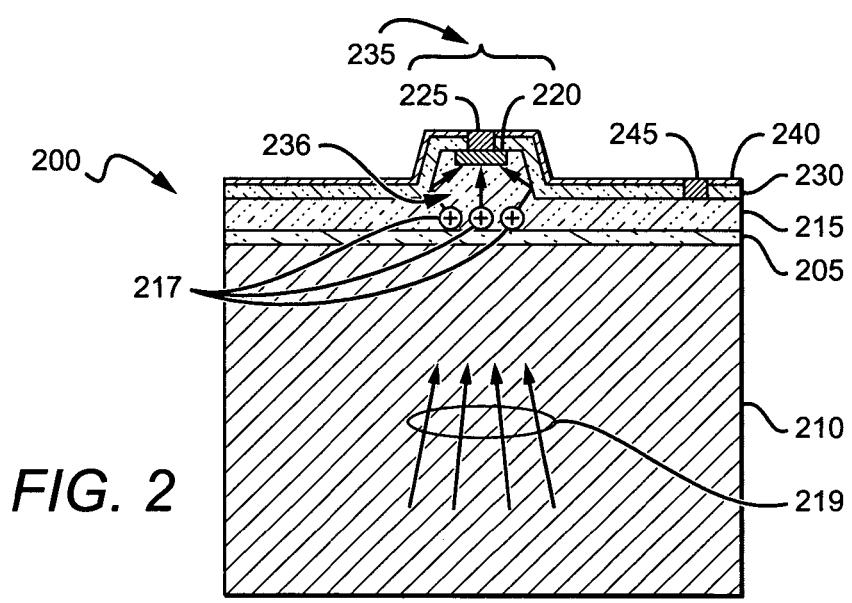
FIG. 2 is a cross-sectional view of a mesa-reticulated single-pixel photodetector in accordance with one embodiment of the invention.

In one implementation of the invention shown in FIG. 2, a photodetector 200 includes an N+ buffer layer 205 on a substrate 210 that is transparent to the wavelength of interest, and for a wavelength greater than approximately 0.9 μm is preferably Cadmium Zinc Telluride (CdZnTe). The N+ buffer layer 205 may be formed by in-situ doping during growth by MBE, by ion implantation or diffusion. An N absorber layer 215 sits on the N+ buffer layer 205 to produce electron and hole charge carriers 217 (hole charge carriers 217 are illustrated) in response to absorbing photons. The charge carriers 217 migrate by either diffusion or a combination of drift and diffusion, if the layer is compositionally graded, to a P—N junction formed between the N absorber layer 215 and a P collector layer 220 which is much smaller in area than the prior art collector layer 120. This smaller area greatly reduces the likelihood of randomly located defects intersecting the P—N junction, located between the absorber and collector layers 215, 220, and thus increases the manufacturing yield and overall operability of the detector array. Also, the N+ buffer layer 205 acts as a back side passivation to inhibit recombination at the buffer/absorber layer junction 205, 215. A metal layer 225 contacts the P collector layer 220 and the photodetector's cathode C (not shown). A passivation layer 230 is provided on the other side of N absorber layer 215 from buffer layer 205 and is formed from a low recombination velocity passivant, preferably Cadmium Telluride (CdTe), to act as a reflector for the charge carriers 217. Because N absorber layer 215 is preferably formed with a compositional grading that results in a progressively lower band gap from the N+ buffer layer 205 to the passivation layer 230, the charge carriers 217 drift upwards towards the collector layer 220. The wider bandgap of the buffer layer 205 compared to the N absorber layer 215 and the higher doping of this layer compared to the absorber layer prevents charge carriers from readily recombining at the interface between the absorber layer 215 and buffer layer 205.

Figure 3:
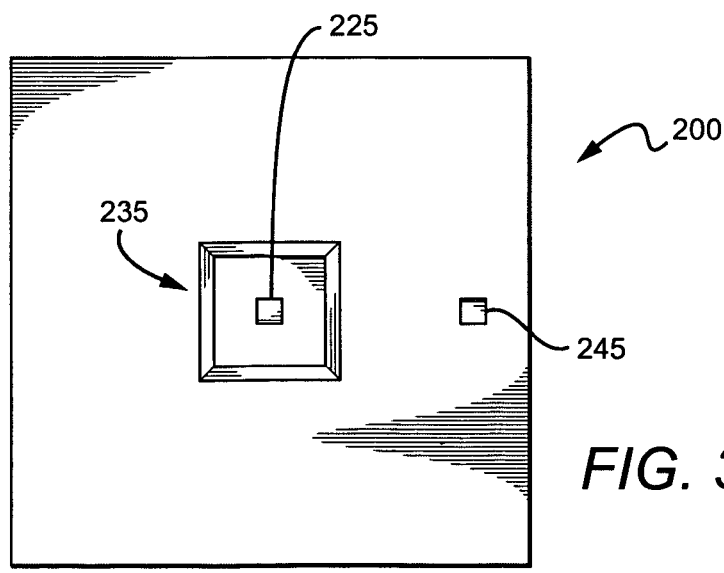
FIG. 3 is a plan view of the photodetector of FIG. 2.

The N absorber layer 215 is initially considerably thicker than shown in FIG. 2. As illustrated in FIGS. 2 and 3, during manufacture this thicker layer is etched from above to form a mesa 235 prior to deposition of the passivation layer 230. This reduces the volume of N absorber layer 215 that would otherwise be available to produce thermally generated charge carriers. The absorber layer mesa 235 establishes a partially isolated absorber region 236, with the collector layer 220 at the top of the mesa. The side walls of this mesa 235 act as a charge carrier concentrator for the collector layer 220, allowing it to collect charge carriers from a space larger than its own area. Charge carriers 217 that are not initially headed towards collector layer 220 but reach the side wall of mesa 235 are reflected and redirected by the passivation layer 230, and a good portion will reach the collector layer 210 prior to recombination. As a result, a portion of the charge carriers 217 that would otherwise diffuse laterally away from the P collector layer 220 are redirected back towards the collector layer 220 for possible capture by layer 220 prior to recombination. In this manner, described charge concentration structure increases the QE of the photodetector 200, with fewer charge carriers lost to recombination.

A dielectric encapsulation layer 240 is deposited on the passivation layer 230 to provide an environmental barrier and insulator for the photodetector 200. The encapsulation layer 240 is preferably formed of Zinc Sulfide (ZnS) or Silicon Nitride (Si3N4). A passivation metal contact 245 sits on the N absorber layer 215 and extends up through the passivation and encapsulation layers 230, 240 to establish the photodetector's common contact. Junction and passivation metal contacts 225 and 245 are preferably Gold, but can be Nickel, Molybdenum or other suitable metals.

In one photodetector designed for sensitivity in the infrared portion of the electromagnetic spectrum, the various elements of the photodetector have the approximate thicknesses listed in Table 1.

TABLE 1

| | Thickness (microns) |
|---|---|
| N+ buffer layer 205 | 1-5 |
| substrate 210 | 800 |
| N absorber layer 215 | 10 |
| P collector layer 220 | 0.7 |
| Metal collector layer layer 225 | 0.5 |
| passivation layer 230 | 0.7 |
| mesa 235 | 5 |

TABLE 1-continued

| | Thickness (microns) |
|---|---|
| encapsulation layer 240 | 0.3 |

The dopant types in the photodetector 200 described above may be reversed. For example, the N absorber layer 215 and P collector layer 220 may be doped N and P, respectively. In the same implementation, the N+ buffer layer 205 would be P+ doped. Also, a photodetector designed for shorter wavelength sensitivity would have a thinner absorber layer 215.

As illustrated in FIG. 3, the photodetector 200 and mesa 235 are each preferably formed in the shape of a square. The mesa may form other polygonal shapes or may also form curved portions. The metal layer 225 extends up to the top of the mesa 235. Additionally, the proportion of mesa area to photodetector 200 area may be modified to suit the needs of the designer. Absorber layer contact 245 is also illustrated.

Figure 4:
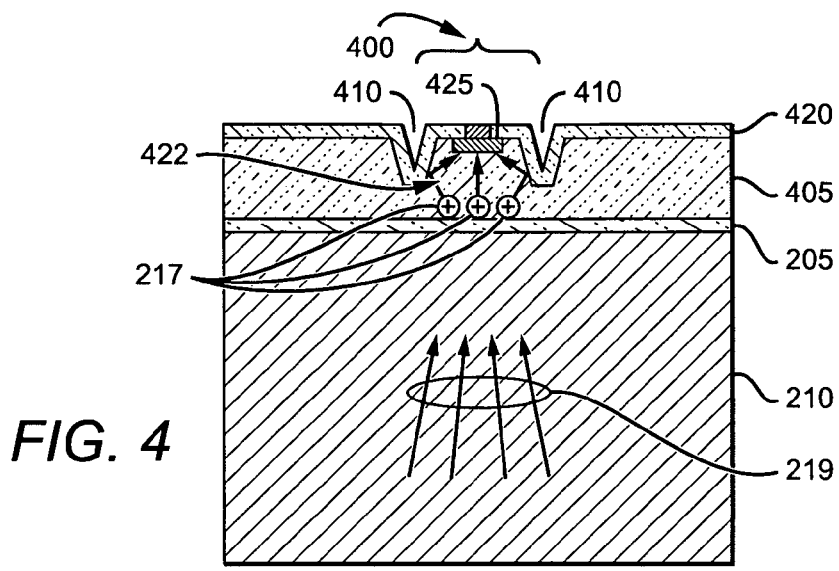
FIG. 4 is a cross-sectional view of a trench-reticulated photodetector in accordance with another embodiment of the invention.

FIG. 4 shows an embodiment of the invention that uses a trench-reticulated mesa 400. An absorber layer 405 is etched with V-shaped trenches 410 prior to deposition of a passivation layer 420. The mesa 400 establishes a partially isolated absorber region 422 with the interior sidewalls of the trenches 410 and the passivation layer 420 forming a reflector for improved charge carrier diffusion within the mesa 400. As described above for FIG. 2, charge carriers created as a result of the absorption of photons 219 in the absorber layer 405 migrate by diffusion towards a P collector layer 425. Charge carriers that diffuse laterally in the mesa 400 are reflected off of the passivation layer 420 back towards the P collector layer 425. In this manner, the QE of the photodetector is increased from the capture of charged carriers 217 that would otherwise have migrated away from the collector layer 425. N+ buffer layer sits on substrate 210 to reduce charge carrier migration down and away from the P collector layer 425.

Figure 5:
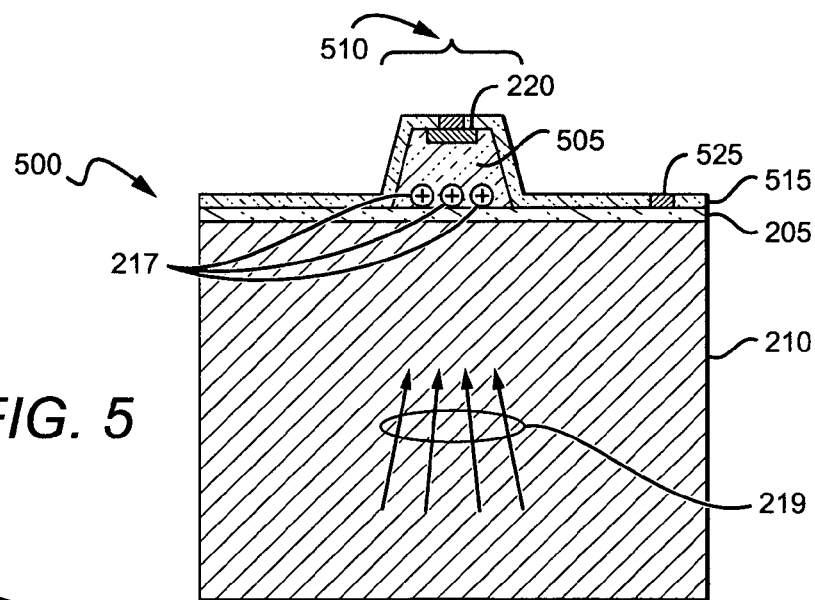
FIG. 5 is a cross-sectional view of a mesa-reticulated photodetector that has, in one embodiment of the invention, a fully etched absorber layer.

FIG. 5 illustrates, in one embodiment of the invention, a mesa-reticulated photodetector 500 with a greatly reduced N absorber layer 505 to reduce dark current generation and lateral diffusion of charge carriers. In this embodiment, the portion of N absorber layer 505 outside of the mesa area 510 is removed prior to deposition of the passivation layer 515. N+ buffer layer 205 sits on substrate 210 and acts as back passivation to reduce recombination of the charge carriers away from the P collector layer 220. A contact 525 is made through the passivation layer 515 to the N+ buffer layer 205 to permit communication with the absorber layer 505, above. Photons 219 absorbed by the N absorber layer 505 induce charge carriers 217 that generally migrate towards the P collector layer 220 as a result of compositional grading. Charge carriers that would otherwise have migrated laterally are reflected by the passivation layer 515 to return towards collector layer 220 for collection to increase the overall QE of the photodetector 500.

Figure 6:
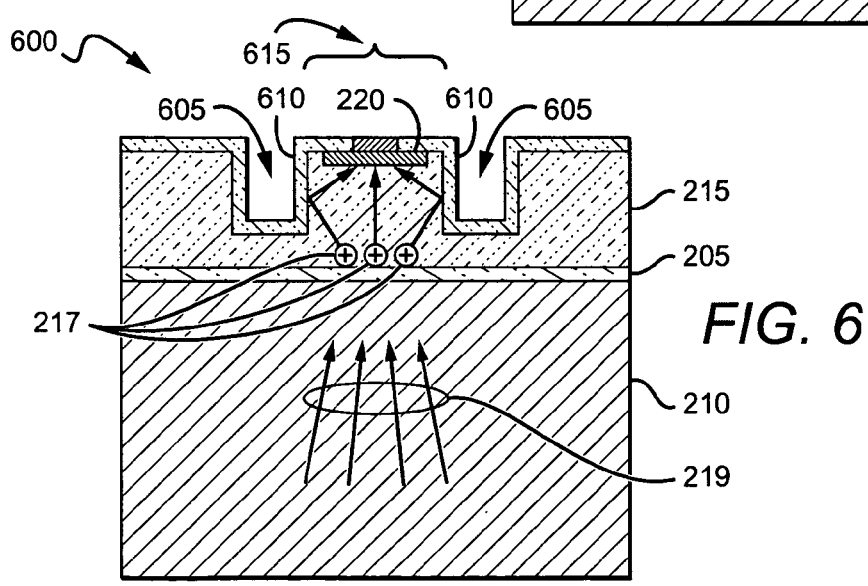
FIG. 6 is a cross-sectional view of a trench-reticulated photodetector that establishes a mesa.

FIG. 6 illustrates a trench-reticulated photodetector 600 with generally rectangular trenches 605. N+ buffer layer 205 is formed on substrate 210 with the N absorber layer 215 sitting on the buffer layer 205. In the illustrated embodiment, passivation layer 610 is deposited on the sidewalls of the trenches 605 to form a reflector for the charge carriers 217 in the mesa 615. Upon absorption of photons 219 to excite charge carriers 217, the charge carriers migrate towards the P collector layer 220.

Figure 7:
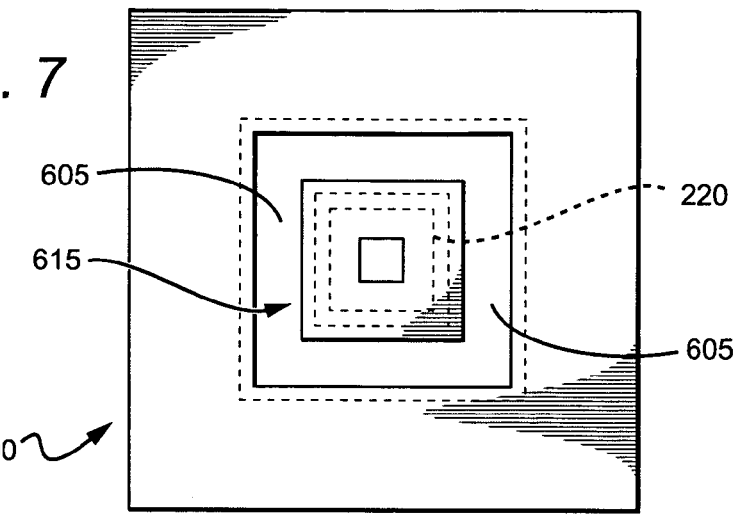
FIG. 7 is a plan view of the photodetector embodiment illustrated in FIG. 6.

In one implementation of the photodetector 600 illustrated in FIG. 6, FIG. 7 illustrates the trenches formed in a generally square configuration to establish the mesa 615. P collector layer 220 is also illustrated in a square configuration although it may form other polygonal or curved shapes.

Figure 8:
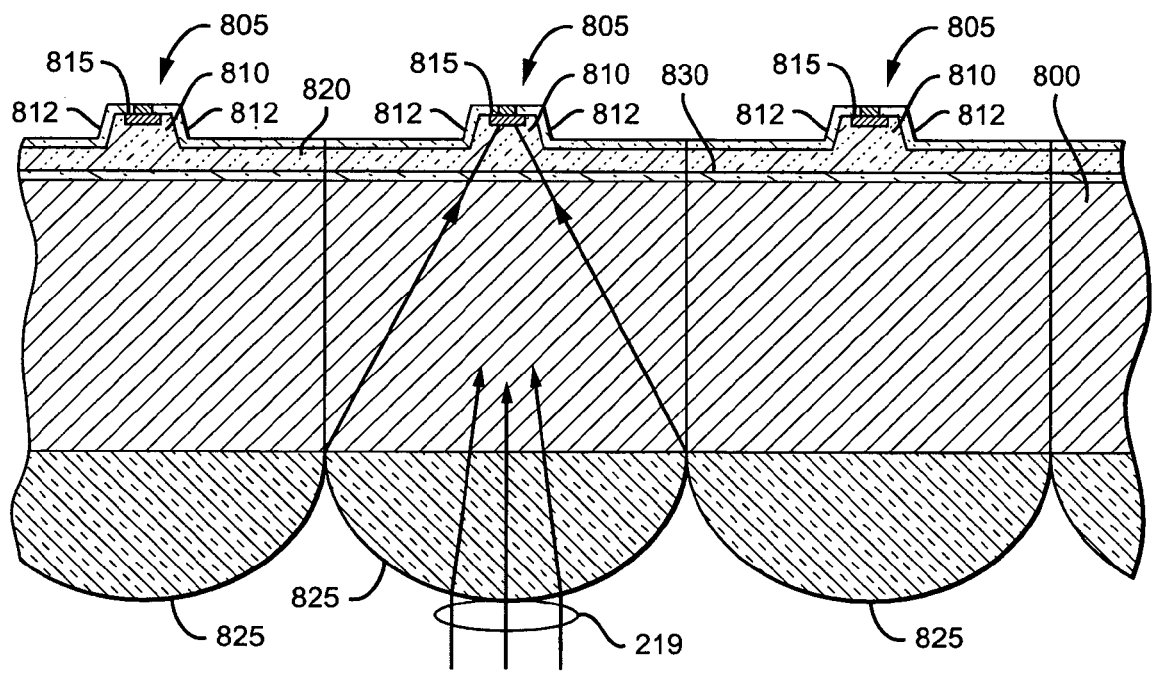
FIG. 8 illustrates, in one embodiment of the invention, a plurality of mesa-reticulated photodetectors, each having a microlens to direct illumination to the absorber layer in its mesa.

FIG. 8 illustrates a collection of mesa-reticulated photodetectors on a single substrate 800. Mesas 805 each have an interior portion 810 with surrounding sidewalls 812, with the sidewalls 812 acting as a charge carrier concentrator for respective collector layers 815 that sit on the top of each respective interior portion 810. Each interior portion 810 preferably shares a common absorber layer 820. Alternatively, the mesa may be extended to the buffer layer 830 which then replaces the absorber as the common contact layer. A microlens 825 for each mesa is aligned with each collector layer 815 such that incoming illumination 219 that would otherwise illuminate an entire photodetector is focused into a portion of its respective absorber layer 820 that is adjacent to its collector layer 815. Photon absorption excites charge carriers proportionally with the intensity of the photon energy impinging on the interior portion 810. As in the embodiments illustrated in FIGS. 2-7, the sidewalls are preferably formed of a passivation layer such as CdTe with a substrate formed of CdZnTe. A buffer layer 830 inhibits recombination of the charge carriers from the absorber layer 820 into the substrate 800. Charge carriers diffuse through the absorber layer for capture by the collector layer 815.

While various implementations of the application have been described, it will be apparent to those of ordinary skill in the art that many more embodiments and implementations are possible that are within the scope of this invention.

I claim:

1. A photodetector system, comprising:
   an absorber layer establishing a mesa and generating charge carriers in response to photon absorption;
   a passivation layer on said mesa to reflect charge carriers from side walls of said mesa to reduce lateral diffusion of said charge carriers; and
   a collector layer recessed in said mesa to capture reflected charge carriers and charge carriers directly incident from said absorber layer, the lateral boundaries of said collector layer being spaced apart from said side walls;
   wherein said collector layer lateral boundary spacing allows increased photodetector system manufacturing yields without adversely affecting overall QE.

2. The apparatus according to claim 1, further comprising a microlens positioned to direct illumination towards said mesa.

3. A system for detecting photons, comprising:
   a reticulated pixel comprising:
      a collector layer;
      an absorber layer that generates charge carrier pairs in response to
   absorbed photons; and
   a charge carrier reflector that reflects at least some of said charge carriers toward said collector layer, the lateral boundaries of said collector layer being spaced apart from said charge carrier reflector; and
   a microlens positioned to direct photons into said absorber layer;
   wherein said collector layer lateral boundary spacing allows increased photodetector system manufacturing yields without adversely affecting overall QE.

4. The system according to claim 3, wherein said charge-carrier reflector comprises a passivation layer adjacent said absorber layer.

5. The system according to claim 4, wherein a portion of said absorber layer has a mesa shape, and said passivation layer is disposed on said mesa.

6. The system according to claim 3, wherein said microlens is spaced apart from said absorber layer by a transparent substrate.

7. The system according to claim 3, wherein said reticulated pixel further comprises
   a buffer layer on said absorber layer; and
   a common contact in communication with said absorber layer.

* * * * *